(12) United States Patent
Chen

(10) Patent No.: US 10,045,446 B2
(45) Date of Patent: Aug. 7, 2018

(54) HOUSING OF ELECTRONIC PRODUCT WITH NON-REMOVABLE BATTERY BUILT THEREIN

(71) Applicant: ZTE CORPORATION, Shenzhen, Guangdong Province (CN)

(72) Inventor: Zexu Chen, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 22 days.

(21) Appl. No.: 15/322,721

(22) PCT Filed: Jun. 30, 2014

(86) PCT No.: PCT/CN2014/081261
§ 371 (c)(1),
(2) Date: Dec. 28, 2016

(87) PCT Pub. No.: WO2015/131469
PCT Pub. Date: Sep. 11, 2015

(65) Prior Publication Data
US 2017/0156222 A1    Jun. 1, 2017

(30) Foreign Application Priority Data

Mar. 6, 2014 (CN) .................... 2014 2 0100568 U

(51) Int. Cl.
*H05K 5/00* (2006.01)
*H05K 5/02* (2006.01)
*H01M 2/10* (2006.01)

(52) U.S. Cl.
CPC ........ *H05K 5/0086* (2013.01); *H01M 2/1022* (2013.01); *H05K 5/0208* (2013.01); *H01M 2220/30* (2013.01)

(58) Field of Classification Search
None
See application file for complete search history.

(56) References Cited

U.S. PATENT DOCUMENTS

| | | | | |
|---|---|---|---|---|
| 2004/0089570 A1* | 5/2004 | Chien | ..................... | H04M 1/18 206/320 |
| 2009/0174995 A1* | 7/2009 | Prest | .................... | H05K 5/0017 361/679.21 |

FOREIGN PATENT DOCUMENTS

| | | |
|---|---|---|
| CN | 2567922 Y | 8/2003 |
| CN | 203243406 U | 10/2013 |
| CN | 203423717 U | 2/2014 |
| JP | 2012199649 A | 10/2012 |
| TW | M467284 U | 12/2013 |

* cited by examiner

*Primary Examiner* — Courtney Smith
*Assistant Examiner* — Rashen E Morrison
(74) *Attorney, Agent, or Firm* — Ling Wu; Stephen Yang; Ling and Yang Intellectual Property

(57) ABSTRACT

A housing of an electronic product with a non-removable battery built therein includes: a front shell (6) located at the front of the housing, a battery cover (1) located at the back of the housing, a rear shell (2) located between the front shell and the battery cover, a battery compartment formed by connecting the rear shell and the battery cover, and a battery (7) arranged in the battery compartment. The housing of an electronic product with a non-removable battery built therein also includes an anti-removal assembly used for connecting the battery cover to the rear shell to prevent the battery from being removed.

8 Claims, 1 Drawing Sheet

HOUSING OF ELECTRONIC PRODUCT WITH NON-REMOVABLE BATTERY BUILT THEREIN

TECHNICAL FIELD

The utility model relates to electronic products, and in particular, to a housing of an electronic product with a non-removable battery built therein.

BACKGROUND

In the existing art, the anti-removal design for an electronic product with a non-removable battery built therein normally aims at a mainboard located within a housing of the electronic product. The specific approach is to paste a fragile sticker on a front-back-shell locking screw hidden within the housing of the electronic product. Though that prevents the occurrence of the phenomenon that a user removes front and back shells to take out the mainboard, it cannot effectively prevent the user from removing the battery after the battery cover is disassembled and taken down. Therefore, the damages to the battery and the connectivity between the battery and the mainboard are caused artificially.

SUMMARY

In order to overcome the problem existing in the above existing art, the embodiment of the utility model provides a housing of an electronic product with a non-removable battery built therein. An anti-removal assembly of the housing can effectively avoid the situation that a battery is removed after a battery cover is removed, and effectively avoid the damages to the battery and the connectivity of the mainboard thereof.

The embodiment of the utility model provides the following technical scheme.

A housing of an electronic product with a non-removable battery built therein includes: a front shell located at the front of the housing; a battery cover located at the back of the housing; a rear shell located between the front shell and the battery cover; a battery compartment formed by connecting the rear shell and the battery cover; a battery arranged in the battery compartment; and an anti-removal assembly used for connecting the battery cover to the rear shell to prevent the battery from being removed.

Alternatively, the anti-removal assembly includes: a battery cover connection plate extending inwards within the housing from an inwall of the battery cover; and a screw used for connecting the battery cover connection plate to the rear shell; herein, the rear shell is provided with a screw hole for connecting the battery cover connection plate.

Alternatively, a BOSS pillar corresponding to the screw hole is arranged at the battery cover connection plate.

Alternatively, an extension direction of the battery cover connection plate is parallel to a connection plane of the rear shell connecting with the battery cover connection plate.

Alternatively, a location of the battery cover connection plate is adjacent to the connection plane of the rear shell connecting with the battery cover connection plate.

Alternatively, the anti-removal assembly further includes: a fragile sticker pasted on a screw cap of the screw.

Alternatively, the anti-removal assembly further includes: a sidewall plug installed in the screw hole and located above the screw.

Alternatively, the screw hole is a stepped hole, pore diameters of the screw hole decrease progressively from outside to inside, the screw includes: a first hole located at the outermost layer and used for installing the sidewall plug; a second hole located at the middle layer and used for accommodating the screw cap of the screw; and a third hole located at the innermost layer and used for screwing in a screw body of the screw.

The beneficial effects of the embodiment of the utility model are reflected in the following aspects.

1) The utility model increases the anti-removal assembly used for preventing the battery cover from being removed based on the existing art, thereby effectively avoiding the situation that the battery is removed after the battery cover is removed, and effectively avoiding the damages to the battery and the connectivity of the mainboard thereof.

2) The sidewall plug arranged by the anti-removal assembly for the battery cover of the utility model is used for sealing the screw hole, which can not only prevent the fragile sticker pasted on the screw from being damaged, but also can guarantee the coordination of the product appearance.

DESCRIPTION OF DRAWING REFERENCE SIGNS

1—Battery cover; 12—Battery cover connection plate; 12a—BOSS pillar; 2—Rear shell; 21—Screw hole; 21a—First hole; 21b—Second hole; 21c—Third hole; 3—Sidewall plug; 4—Fragile sticker; 5—Screw; 6—Front shell; 7—Battery; and 8—Mainboard.

SPECIFIC EMBODIMENTS

Figure 1:
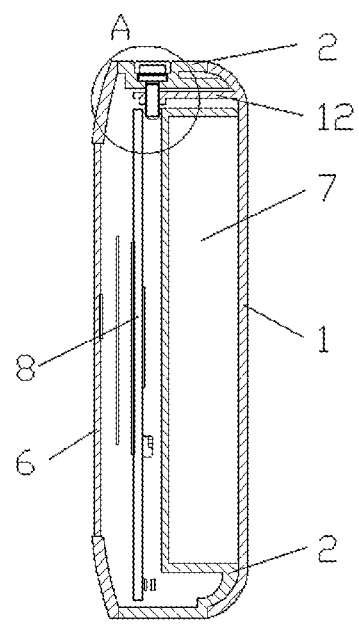
FIG. 1 is a cut-away view of the utility model.

A housing of an electronic product with a non-removable battery built therein of the embodiment of the present document, as shown in FIG. 1, includes: a front shell 6 located at the front of the housing; a battery cover 1 located at the back of the housing; a rear shell 2 located between the front shell 6 and the battery cover 1; a battery compartment formed by connecting the rear shell 2 and the battery cover 1; a non-removable battery 7 arranged in the battery compartment; and an anti-removal assembly used for connecting the battery cover 1 to the rear shell 2 to prevent the battery 7 from being removed after the battery cover 1 is removed.

Herein, the front shell 6, the rear shell 2 and the battery cover 1 are connected to form a space for accommodating and protecting an inner structure of the housing of the electronic product.

As shown in FIG. 1, a mainboard 8 is arranged in the space formed by connecting the front shell 6 and the rear shell 2. The mainboard 8 can be anti-removal. The specific approach is to paste a fragile sticker on a front-back-shell locking screw (not shown in the figure) hidden within the housing of the electronic product and used for connecting the front shell 6 and the rear shell 2.

The battery 7 is arranged in the battery compartment formed by connecting the rear shell 2 and the battery cover 1. The battery 7 is a non-removable battery. The battery 7 of the utility model can be anti-removal. The specific approach is to arrange the anti-removal assembly which prevents the battery cover 1 covering the battery 7 from being removed.

Figure 2:
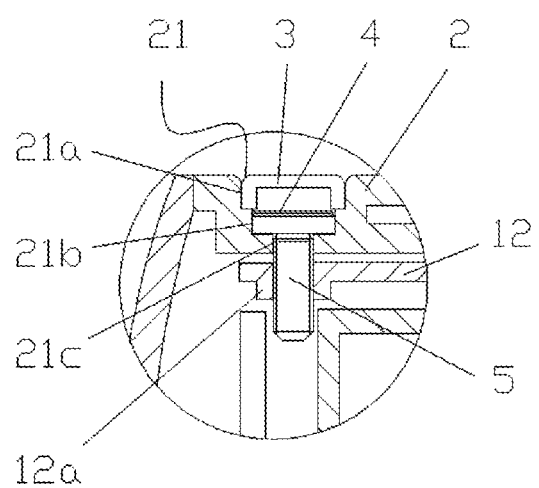
FIG. 2 is an enlarged view of the part A in the FIG. 1.

As shown in FIG. 1 and FIG. 2, the anti-removal assembly includes: a battery cover connection plate 12 extending inwards within the housing from an inwall of the battery cover 1, in order to connect the battery cover 1 to the rear shell 2; and a screw 5 used for connecting the battery cover connection plate 12 to the rear shell 2. Herein, the rear shell 2 is provided with a screw hole 21 for connecting the battery cover connection plate 12.

The anti-removal assembly also includes: a fragile sticker 4 pasted on a screw cap of the screw 5; and a sidewall plug 3 installed in the screw hole 21 and located above the screw 5. The sidewall plug 3 is used for hiding the screw 5 and plays a role of protecting the screw 5 and the fragile sticker 4, and guarantees the product appearance to be nice-looking.

Specifically, in order to make the battery cover connection plate 12 and the rear shell 2 be connected firmly, a BOSS pillar 12a corresponding to the screw hole 21 is arranged at the battery cover connection plate 12.

When the rear shell 2 and the battery cover connection plate 12 are connected, firstly, the screw 5 orderly passes through the screw hole 21 and the BOSS pillar 12a located below the screw hole 21, thereby completes fastening the rear shell 2 and the battery cover connection plate 12. Secondly, the fragile sticker 4 is pasted on the screw cap of the screw 5. Since a torn fragile sticker 4 is invalid, a user cannot privately remove the screw 5, thereby preventing the battery cover 1 from being removed from the rear shell 2 to exposure the battery 7, and preventing the battery 7 from being damaged by the user. At last, the sidewall plug 3 is stuffed into the screw hole 21 to hide the screw 5 pasted with the fragile sticker 4.

In order to make the battery cover connection plate 12 and the rear shell 2 be connected reliably and conveniently, an extension direction of the battery cover connection plate 12 of the embodiment of the utility model is parallel to a connection plane of the rear shell 2 connecting with the battery cover connection plate 12, and a location of the battery cover connection plate 12 is adjacent to the connection plane of the rear shell 2 connecting with the battery cover connection plate. In this way, it is easy to install the screw 5 used for connecting the battery cover connection plate 12 and the rear shell 2, and saves the space within the housing as well.

Furthermore, in order to make the anti-removal assembly be installed reliably, the screw hole 21 is designed as a stepped hole. Pore diameters of the screw hole 21 decrease progressively from outside to inside. The screw hole 21 includes: a first hole 21a located at the outermost layer and used for installing the sidewall plug 3, a pore diameter of the first hole 21a is the longest; a second hole 21b located at the middle layer and used for accommodating the screw cap of the screw 5; and a third hole 21c located at the innermost layer and used for screwing in a screw body of the screw 5, a pore diameter of the third hole 21c is the shortest.

The size of the sidewall plug 3 is matched with the first hole 21a. When the sidewall plug 3 is stuffed into the first hole 21a, the outwall of the rear shell 2 provided with the screw hole 21 is smooth and flat, and the product appearance is nice-looking.

The screw hole 21 of the embodiment of the utility model may be arranged beside a card slot for installing an SIM card according to the actual requirements, and it may be arranged independently. When the screw hole 21 is arranged beside the card slot for the SIM card, a sidewall plug shared by the card slot and the screw hole 21 may be made.

Though the utility model has been described in detail above, the utility model is not limited to that. The people skilled in the art can make modifications according to the principle of the utility model. Therefore, various modifications made according to the principle of the utility model all should be considered to fall into the protection scope of the utility model.

What I claim is:

1. A housing of an electronic product with a battery built therein, comprising:
    a front shell located at the front of the housing;
    a battery cover located at the back of the housing;
    a rear shell located between the front shell and the battery cover;
    a battery compartment formed by connecting the rear shell and the battery cover;
    the battery arranged in the battery compartment; and
    an anti-removal assembly used for connecting the battery cover to the rear shell to prevent the battery from being removed;
    wherein the anti-removal assembly comprises: a battery cover connection plate extending inwards within the housing from an inwall of the battery cover;
    wherein the rear shell is provided with a screw hole for connecting the battery cover connection plate, and the screw hole is a stepped hole, and pore diameters of the screw hole decrease progressively from outside to inside.

2. The housing according to claim 1, wherein, the anti-removal assembly further comprises:
    a screw used for connecting the battery cover connection plate to the rear shell.

3. The housing according to claim 2, wherein, a BOSS pillar corresponding to the screw hole is arranged at the battery cover connection plate.

4. The housing according to claim 3, wherein, an extension direction of the battery cover connection plate is parallel to a connection plane of the rear shell connecting with the battery cover connection plate.

5. The housing according to claim 4, wherein, a location of the battery cover connection plate is adjacent to the connection plane of the rear shell connecting with the battery cover connection plate.

6. The housing according to claim 3, wherein, the anti-removal assembly further comprises: a fragile sticker pasted on a screw cap of the screw.

7. The housing according to claim 6, wherein, the anti-removal assembly further comprises: a sidewall plug installed in the screw hole and located above the screw.

8. The housing according to claim 7, wherein the screw hole comprises:
    a first hole located at the outermost layer and used for installing the sidewall plug;
    a second hole located at the middle layer and used for accommodating the screw cap of the screw; and
    a third hole located at the innermost layer and used for screwing in a screw body of the screw.

* * * * *